United States Patent
Li et al.

(10) Patent No.: US 11,195,484 B2
(45) Date of Patent: Dec. 7, 2021

(54) DISPLAY PANEL INCLUDING DEMULTIPLEXER, METHOD OF DRIVING THE SAME AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lei Li, Beijing (CN); Jun Fan, Beijing (CN); Le Ta, Beijing (CN); Yusheng Liu, Beijing (CN); Yongqiang Zhang, Beijing (CN); Mei Li, Beijing (CN); Yafei Li, Beijing (CN); Peng Liu, Beijing (CN); Zhixuan Guo, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/041,357

(22) PCT Filed: Apr. 16, 2020

(86) PCT No.: PCT/CN2020/085132
§ 371 (c)(1),
(2) Date: Sep. 24, 2020

(87) PCT Pub. No.: WO2020/211817
PCT Pub. Date: Oct. 22, 2020

(65) Prior Publication Data
US 2021/0166645 A1 Jun. 3, 2021

(30) Foreign Application Priority Data
Apr. 18, 2019 (CN) .......................... 201910314314.1

(51) Int. Cl.
*G09G 3/36* (2006.01)
*H01L 27/12* (2006.01)
(Continued)

(52) U.S. Cl.
CPC ......... *G09G 3/3607* (2013.01); *G09G 3/3648* (2013.01); *G09G 3/3685* (2013.01);
(Continued)

(58) Field of Classification Search
CPC .. G09G 3/3607; G09G 3/3648; G09G 3/3685; G09G 2300/0426;
(Continued)

(56) References Cited

U.S. PATENT DOCUMENTS

| 2003/0117362 A1 | 6/2003 | An |
| 2014/0009375 A1 | 1/2014 | Tsai et al. |

(Continued)

FOREIGN PATENT DOCUMENTS

| CN | 102800296 A | 11/2012 |
| CN | 103714784 A | 4/2014 |

(Continued)

OTHER PUBLICATIONS

First Office Action for Chinese Application No. 201910314314.1, dated Oct. 16, 2020, 8 Pages.
(Continued)

*Primary Examiner* — Kwang-Su Yang
(74) *Attorney, Agent, or Firm* — Brooks Kushman P.C.

(57) ABSTRACT

The present disclosure provides a display panel, a method of driving the display panel and a display device. Each signal input sub-circuitry of the display panel includes at least two transistors. A same control signal is applied to control signal lines corresponding to a same signal input sub-circuitry, different control signals are applied to control signal lines corresponding to different signal input sub-circuitries, and
(Continued)

time periods within which the different control signals are at active levels are staggered from each other. A sum of width-to-length ratios of channels of the at least two transistors is equal to a first predetermined value, and an overlapping area of the gate electrode of each of the at least two transistors relative to an active layer of the transistor is smaller than a second predetermined value in a direction perpendicular to a base substrate of the display panel.

14 Claims, 8 Drawing Sheets

(51) Int. Cl.
  *G02F 1/1362* (2006.01)
  *G02F 1/1368* (2006.01)

(52) U.S. Cl.
  CPC .......... *H01L 27/124* (2013.01); *G02F 1/1368* (2013.01); *G02F 1/136286* (2013.01); *G09G 2300/0426* (2013.01); *G09G 2300/0443* (2013.01)

(58) Field of Classification Search
  CPC .......... G09G 2300/0443; H01L 27/124; G02F 1/136286; G02F 1/1368
  See application file for complete search history.

(56) References Cited

U.S. PATENT DOCUMENTS

| | | | |
|---|---|---|---|
| 2014/0091996 | A1 | 4/2014 | Moon et al. |
| 2018/0158431 | A1 | 6/2018 | Fujikawa |
| 2019/0079330 | A1* | 3/2019 | Yamamoto .......... H01L 27/1225 |
| 2019/0273167 | A1* | 9/2019 | Saitoh ............... H01L 29/66969 |
| 2020/0242996 | A1 | 7/2020 | Wang et al. |
| 2021/0027703 | A1 | 1/2021 | Lin |

FOREIGN PATENT DOCUMENTS

| | | |
|---|---|---|
| CN | 206096714 U | 4/2017 |
| CN | 206209225 U | 5/2017 |
| CN | 207425328 U | 5/2018 |
| CN | 108257577 A | 7/2018 |
| CN | 108447435 A | 8/2018 |
| CN | 108550342 A | 9/2018 |
| CN | 208062051 U | 11/2018 |
| CN | 208521935 U | 2/2019 |
| CN | 109584778 A | 4/2019 |
| CN | 109872700 A | 6/2019 |
| CN | 208970143 U | 6/2019 |
| JP | 2015043030 A | 3/2015 |
| WO | 2019068213 A1 | 4/2019 |

OTHER PUBLICATIONS

International Search Report and Written Opinion for Application No. PCT/CN2020/085132, dated Jul. 22, 2020, 15 Pages.

* cited by examiner

DISPLAY PANEL INCLUDING DEMULTIPLEXER, METHOD OF DRIVING THE SAME AND DISPLAY DEVICE

CROSS-REFERENCE TO RELATED APPLICATIONS

This application is the U.S. national phase of PCT Application No. PCT/CN2020/085132 filed on Apr. 16, 2020, which claims priority to Chinese Patent Application No. 201910314314.1 filed on Apr. 18, 2019, which are incorporated herein by reference in their entireties.

TECHNICAL FIELD

The present disclosure relates to the field of display technology, in particular to a display panel, a method of driving the display panel and a display device.

BACKGROUND

Along with the development of the display technology, the demand for a resolution of a display product has increased. The higher the resolution of the display product, the more the required data signal lines. Each data signal line is coupled to a source driving Integrated Circuit (IC) in the display product, and a data signal line is applied by the source driving IC to the data signal line. However, the quantity of pins of the source driving IC capable of being coupled to the data signal lines is limited, so a demultiplexer (DEMUX) is introduced between the source driving IC and the data signal lines. The DEMUX is coupled between one data signal output pin of the source driving IC and a plurality of data signal lines, so as to transmit, in a time-division manner, a data signal from the data signal output pin of the source driving IC to the plurality of data signal lines, thereby to drive the display product.

However, due to a voltage drop for the DEMUX, a loss may occur for the data signal provided by the source driving IC when the data signal is transmitted to the data signal line via the DEMUX. At this time, a voltage value of the data signal actually received by the data signal line is smaller than a voltage value of the data signal provided by the source driving IC, so it is impossible for the display product to provide a target display brightness value.

SUMMARY

In one aspect, the present disclosure provides in some embodiments a display panel, including a plurality of signal input circuitries. At least one of the plurality of signal input circuitries includes: a signal transmission line, a plurality of control signal lines, a plurality of data signal lines and a plurality of signal input sub-circuitries in one-to-one correspondence with the plurality of data signal lines. Each signal input sub-circuitry includes at least two transistors, input electrodes of which are coupled to the signal transmission line, output electrodes of which are coupled to a corresponding data signal line, and gate electrodes of which are coupled to the plurality of control signal lines in one-to-one correspondence. A same control signal is applied to the control signal lines corresponding to a same signal input sub-circuitry, different control signals are applied to the control signal lines corresponding to different signal input sub-circuitries, and time periods within which the different control signals are at active levels are staggered from each other. A sum of width-to-length ratios of channels of the at least two transistors is equal to a first predetermined value, and an overlapping area of the gate electrode of each of the at least two transistors relative to an active layer of the transistor is smaller than a second predetermined value in a direction perpendicular to a base substrate of the display panel.

In a possible embodiment of the present disclosure, the first predetermined value is a width-to-length ratio of a channel of one transistor when each signal input sub-circuitry includes the transistor in a one-to-one correspondence with the data signal line, and the second predetermined value is an overlapping area of a gate electrode of one transistor relative to an active layer of the transistor when each signal input sub-circuitry includes the transistor in a one-to-one correspondence with the data signal line.

In a possible embodiment of the present disclosure, a sum of the overlapping areas of the gate electrodes of the at least two transistors relative to the active layers of the at least two transistors is equal to the second predetermined value in the direction perpendicular to the base substrate.

In a possible embodiment of the present disclosure, the plurality of signal input sub-circuitries are arranged sequentially in a direction perpendicular to an extension direction of the data signal line. Each signal input sub-circuitry includes two transistors arranged sequentially in the extension direction of the data signal line, input electrodes of the two transistors are coupled to each other, output electrodes of the two transistors are coupled to each other, the input electrode of one of the two transistors is coupled to the signal transmission line, and the output electrode of the other one of the two transistors is coupled to the corresponding data signal line.

In a possible embodiment of the present disclosure, two control signal lines corresponding to the two transistors are arranged opposite to each other, and the two transistors are arranged between the two control signal lines.

In a possible embodiment of the present disclosure, the active layer of each transistor includes at least two active patterns independent of each other, and an orthogonal projection of each active pattern onto the base substrate partially overlaps an orthogonal projection of the gate electrode of the transistor onto the base substrate, an orthogonal projection of the input electrode of the transistor onto the base substrate, and an orthogonal projection of the output electrode of the transistor onto the base substrate.

In a possible embodiment of the present disclosure, each signal input circuitry includes at least two signal input sub-circuitries, each of the at least two signal input sub-circuitries is configured to transmit a color data signal from the signal transmission line to a corresponding data signal line, and the data signal line is configured to transmit the color data signal to subpixel units of the display panel corresponding to the data signal line. Each signal input sub-circuitry is further configured to transmit color data signals for different colors to the corresponding subpixel units via the data signal lines, and the subpixels in different colors corresponding to the at least two signal input sub-circuitries achieve color display.

In a possible embodiment of the present disclosure, each signal input circuitry includes a first signal input sub-circuitry, a second signal input sub-circuitry and a third signal input sub-circuitry. The first signal input sub-circuitry is configured to transmit a first color data signal from the signal transmission line to a corresponding data signal line, and the data signal line is configured to transmit the first color data signal to subpixel units of the display panel in a first color corresponding to the data signal line. The second signal input sub-circuitry is configured to transmit a second color data signal from the signal transmission line to a corresponding data signal line, and the data signal line is configured to transmit the second color data signal to subpixel units of the display panel in a second color corresponding to the data signal line. The third signal input sub-circuitry is configured to transmit a third color data signal from the signal transmission line to a corresponding data signal line, and the data signal line is configured to transmit the third color data signal to subpixel units of the display panel in a third color corresponding to the data signal line. Each of the first color, the second color and the third color is one of red, green and blue respectively.

In a possible embodiment of the present disclosure, the first signal input sub-circuitry, the second signal input sub-circuitry and the third signal input sub-circuitry are arranged sequentially in the direction perpendicular to the extension direction of the data signal line. The data signal line includes a first data signal sub-line corresponding to the first signal input sub-circuitry, a second data signal sub-line corresponding to the second signal input sub-circuitry, and a third data signal sub-line corresponding to the third signal input sub-circuitry. The signal transmission line includes a first signal transmission sub-line corresponding to the first signal input sub-circuitry, a second signal transmission sub-line corresponding to the second signal input sub-circuitry, and a third signal transmission sub-line corresponding to the third signal input sub-circuitry. The control signal line includes a first control signal sub-line and a second control signal sub-line corresponding to the first signal input sub-circuitry, a third control signal sub-line and a fourth control signal sub-line corresponding to the second signal input sub-circuitry, and a fifth control signal sub-line and a sixth control signal sub-line corresponding to the third signal input sub-circuitry. The first signal input sub-circuitry includes a first transistor and a second transistor arranged sequentially in the extension direction of the data signal line, input electrodes of the first transistor and the second transistor are coupled to each other, output electrodes of the first transistor and the second transistor are coupled to each other, the input electrode of the first transistor is coupled to the first signal transmission sub-line, the output electrode of the second transistor is coupled to the first data signal sub-line, a gate electrode of the first transistor is coupled to the first control signal sub-line, and a gate electrode of the second transistor is coupled to the second control signal sub-line. The second signal input sub-circuitry includes a third transistor and a fourth transistor arranged sequentially in the extension direction of the data signal line, input electrodes of the third transistor and the fourth transistor are coupled to each other, output electrodes of the third transistor and the fourth transistor are coupled to each other, the input electrode of the third transistor is coupled to the second signal transmission sub-line, the output electrode of the fourth transistor is coupled to the second data signal sub-line, a gate electrode of the third transistor is coupled to the third control signal sub-line, and a gate electrode of the fourth transistor is coupled to the fourth control signal sub-line. The third signal input sub-circuitry includes a fifth transistor and a sixth transistor arranged sequentially in the extension direction of the data signal line, input electrodes of the fifth transistor and the sixth transistor are coupled to each other, output electrodes of the fifth transistor and the sixth transistor are coupled to each other, the input electrode of the fifth transistor is coupled to the third signal transmission sub-line, the output electrode of the sixth transistor is coupled to the third data signal sub-line, a gate electrode of the fifth transistor is coupled to the fifth control signal sub-line, and a gate electrode of the sixth transistor is coupled to the sixth control signal sub-line. The first control signal sub-line, the third control signal sub-line and the fifth control signal sub-line are arranged at a first side of each of the first transistor, the second transistor, the third transistor, the fourth transistor, the fifth transistor and the sixth transistor, and the second control signal sub-line, the fourth control signal sub-line and the sixth control signal sub-line are arranged at a second side of each of the first transistor, the second transistor, the third transistor, the fourth transistor, the fifth transistor and the sixth transistor opposite to the first side.

In a possible embodiment of the present disclosure, each signal input circuitry includes a first signal input sub-circuitry and a second signal input sub-circuitry. The first signal input sub-circuitry is configured to transmit a first color data signal from the signal transmission line to a corresponding data signal line, and the data signal line is configured to transmit the first color data signal to subpixel units of the display panel in a first color corresponding to the data signal line. The second signal input sub-circuitry is configured to transmit a second color data signal from the signal transmission line to a corresponding data signal line, and the data signal line is configured to transmit the second color data signal to subpixel units of the display panel in a second color corresponding to the data signal line. The first color includes one of red, green and blue, and the second color includes another one of red, green and blue.

In a possible embodiment of the present disclosure, the first signal input sub-circuitry and the second signal input sub-circuitry are arranged sequentially in the direction perpendicular to the data signal line. The data signal line includes a first data signal sub-line corresponding to the first signal input sub-circuitry and a second data signal sub-line corresponding to the second signal input sub-circuitry. The signal transmission line includes a first signal transmission sub-line corresponding to the first signal input sub-circuitry and a second signal transmission sub-line corresponding to the second signal input sub-circuitry. The control signal line includes a first control signal sub-line and a second control signal sub-line corresponding to the first signal input sub-circuitry, and a third control signal sub-line and a fourth control signal sub-line corresponding to the second signal input sub-circuitry. The first signal input sub-circuitry includes a first transistor and a second transistor arranged sequentially in the extension direction of the data signal line, input electrodes of the first transistor and the second transistor are coupled to each other, output electrodes of the first transistor and the second transistor are coupled to each other, the input electrode of the first transistor is coupled to the first signal transmission sub-line, the output electrode of the second transistor is coupled to the first data signal sub-line, a gate electrode of the first transistor is coupled to the first control signal sub-line, and a gate electrode of the second transistor is coupled to the second control signal sub-line. The second signal input sub-circuitry includes a third transistor and a fourth transistor arranged sequentially in the extension direction of the data signal line, input electrodes of the third transistor and the fourth transistor are coupled to each other, output electrodes of the third transistor and the fourth transistor are coupled to each other, the input electrode of the third transistor is coupled to the second signal transmission sub-line, the output electrode of the fourth transistor is coupled to the second data signal sub-line, a gate electrode of the third transistor is coupled to the third control signal sub-line, and a gate electrode of the fourth transistor is coupled to the fourth control signal sub-line. The first control signal sub-line and the third control signal sub-line are arranged at a first side of each of the first transistor, the second transistor, the third transistor and the fourth transistor, and the second control signal sub-line and the fourth control signal sub-line are arranged at a second side of each of the first transistor, the second transistor, the third transistor and the fourth transistor opposite to the first side.

In a possible embodiment of the present disclosure, in two adjacent signal input sub-circuitries of the signal input circuitry, the input electrode of the transistor of one signal input sub-circuitry is reused as the input electrode of the transistor of the other signal input sub-circuitry.

In another aspect, the present disclosure provides in some embodiments a display device including the above-mentioned display panel.

In yet another aspect, the present disclosure provides in some embodiments a method of driving the above-mentioned display panel, including: within a charging time period, applying corresponding control signals to the plurality of control signal lines in each signal input circuitry of the display panel, a same control signal being applied to the control signal lines corresponding to a same signal input sub-circuitry of the signal input circuitry, different control signals being applied to the control signal lines corresponding to different signal input sub-circuitries of the signal input circuitry, and time periods within which the different control signals are at active levels being staggered from each other; and when the control signal is at an active level, enabling, by the signal input sub-circuitry, the corresponding signal transmission line to be electrically connected to the corresponding data signal line.

In a possible embodiment of the present disclosure, when each signal input sub-circuitry includes two transistors, the method includes, within the charging time period, when the control signal is at an active level, controlling, by the signal input sub-circuitry, the two transistors to be turned on, so as to enable the corresponding signal transmission line to be electrically connected to the corresponding data signal line.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

Figure 1:
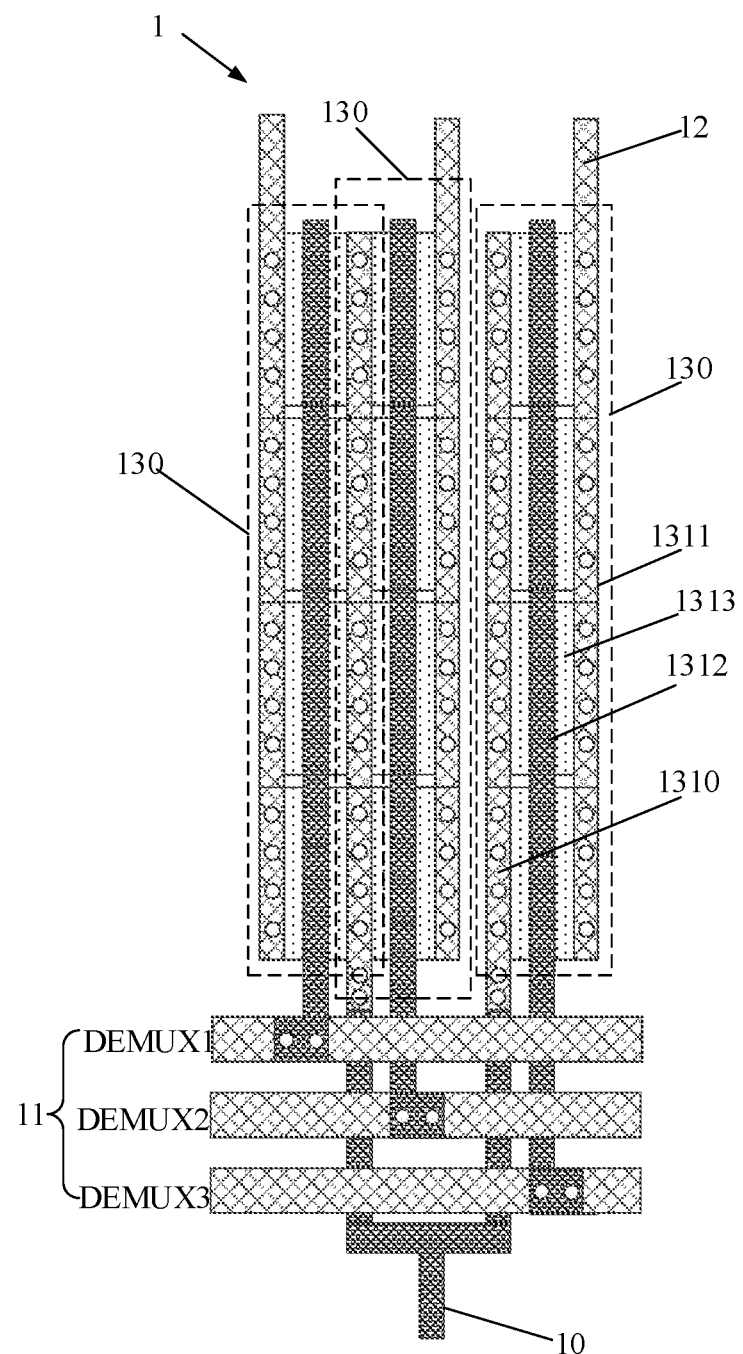
FIG. 1 is a schematic view showing a signal input circuitry in the related art.

The present disclosure will be described hereinafter in conjunction with the drawings and embodiments.

In the related art, taking a liquid crystal display device as an example, it includes a display region and a peripheral region surrounding the display region. A plurality of sub-pixel units arranged in an array form and a plurality of data signal lines are provided at the display region of the liquid crystal display device. Each data signal line is capable of extending to the peripheral region. A demultiplexer (DEMUX) and a source driving Integrated Circuit (IC) are arranged at the peripheral region. The DEMUX is arranged between, and coupled to, the source driving IC and the data signal line, so as to transmit a data signal from the source driving IC to the data signal line. The data signal line is configured to transmit the received data signal to corresponding subpixel units, so as to control the liquid crystal display device to display an image.

The DEMUX mainly consists of transistors, so a loss of the DEMUX itself depends on driving performance of each transistor. More detailedly, the driving performance of the transistor mainly depends on a width-to-length ratio (W/L) and a capacitance of a channel capacitor in the transistor. A resistance of the transistor depends on W/L, i.e., the larger the value of W/L, the smaller the resistance of the transistor and the smaller the loss occurring for the transistor. The channel capacitor formed in the transistor is just a capacitor formed between a gate electrode of the transistor and a portion of an active layer of the transistor directly facing the gate electrode, and a capacitance of the capacitor is in direct proportion to W*L, i.e., the larger the value of W*L, the larger the capacitance of the channel capacitor in the transistor and the larger the loss occurring for the transistor.

For example, when a voltage value of the data signal outputted by the source driving IC is 5V, due to the existence of a voltage drop for the DEMUX itself, a voltage value of the data signal actually transmitted to the data signal line via the DEMUX is merely 4.5V which is smaller than a maximum deflection voltage of liquid crystals, resulting in an insufficient grayscale brightness value of the liquid crystal display device. In addition, when a display product has a relatively high resolution in an extension direction of the data signal line, the liquid crystal display device may be charged insufficiently at an end away from the source driving IC, and thereby display quality of the display product may be adversely affected.

Based on the above analysis on the reasons of the loss caused by the DEMUX, in the embodiments of the present disclosure, the W/L value of the transistor in the DEMUX may be increased, so as to reduce the loss for the transistor and increase the charging capability of the DEMUX. However, in order to increase the W/L value, it is necessary to increase an area of the peripheral region of the display product, so it is adverse to the achievement of a narrow bezel of the display product. In addition, the capacitance of the channel capacitor of the transistor in the DEMUX increases easily, so the charging capability of the DEMUX may be decreased. Alternatively, the capacitance of the channel capacitor of the transistor in the DEMUX may be decreased, so as to reduce the loss for the transistor and increase the charging capability of the DEMUX. However, when the capacitance of the channel capacitor of the transistor in the DEMUX is decreased, the W/L value may be decreased easily, and thereby the charging capability of the DEMUX may be decreased too.

Based on the above, the present disclosure provides in some embodiments a novel DEMUX structure, so as to reduce the capacitance of the channel capacitor of the transistor in the DEMUX without any change in the W/L value, thereby to effectively reduce the loss caused by the DEMUX and increase the charging capability of the DEMUX.

Figure 3:
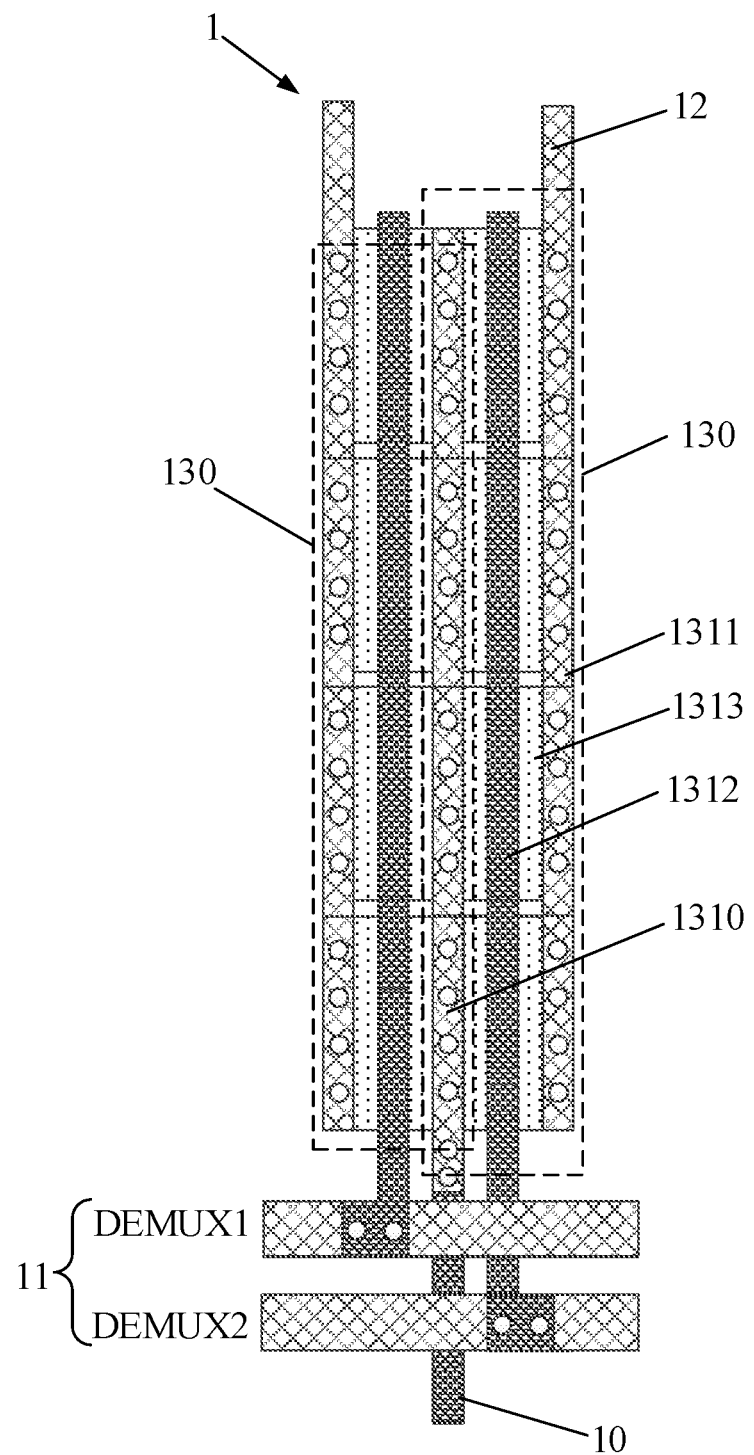
FIG. 3 is another schematic view showing the signal input circuitry in the related art.

To be specific, FIG. 1 shows a 1/3DEMUX, i.e., a data signal from one pin of the source driving IC is transmitted, in a time-division manner, to three data signal lines 12 through the DEMUX. FIG. 3 shows a 1/2DEMUX, i.e., the data signal from one pin of the source driving IC is transmitted, in a time-division manner, to two data signal lines 12 through the DEMUX. As shown in FIG. 1, the DEMUX includes three transistors 130, and an output electrode 1311 of each transistor 130 is coupled to a corresponding data signal line 12. An input electrode 1310 is reused by the two transistor 130, the input electrode 1310 of each transistor 130 is coupled to a same pin of the source driving IC, and a gate electrode 1312 of each transistor 130 is coupled to a corresponding control signal line 11. Each transistor 130 is configured to be in an on state or an off state under the control of a control signal from the control signal line 11, so as to transmit the data signal from the source driving IC to the corresponding data signal line 12.

Figure 4:
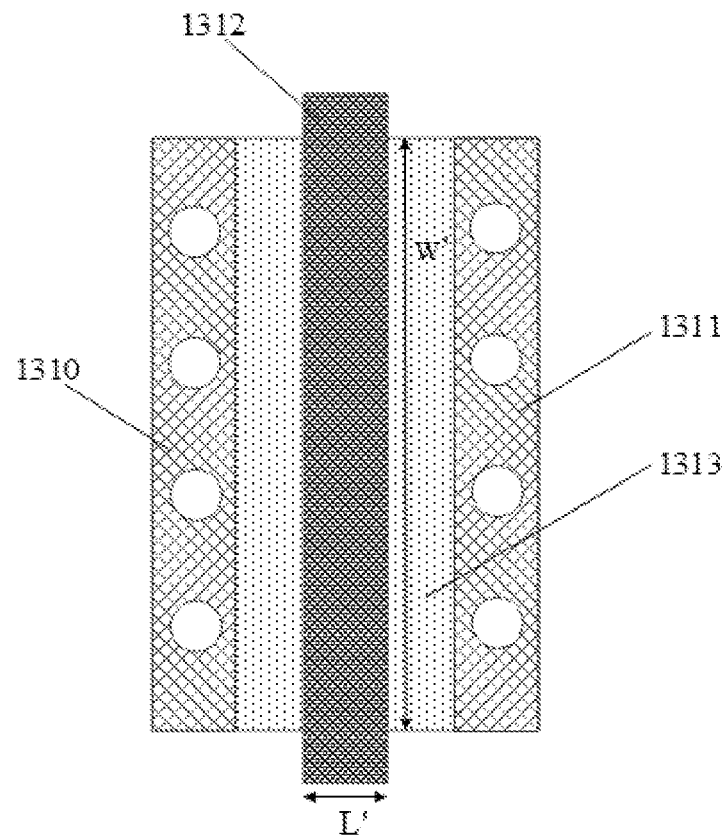
FIG. 4 is a schematic view showing a width-to-length ratio of an active pattern to a gate electrode in the related art.
Figure 5:
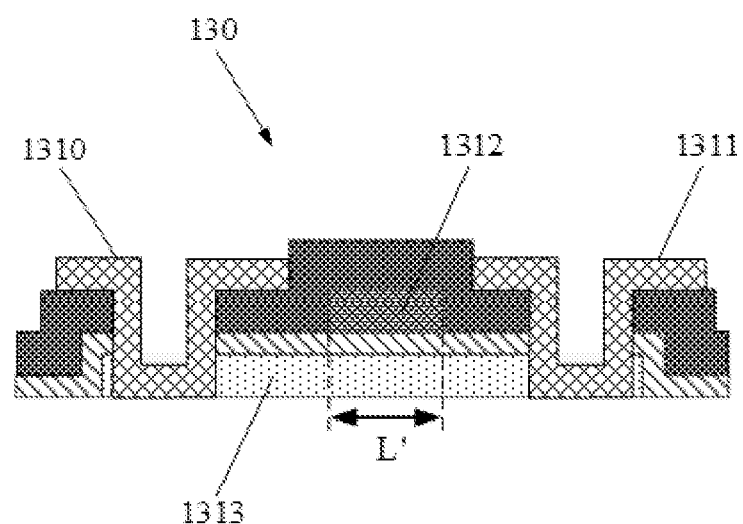
FIG. 5 is a sectional view of a transistor in the related art.

FIG. 4 shows W' and L' of an active pattern 1313. As shown in FIGS. 4 and 5, a W/L value of the transistor 130 corresponding to each data signal line 12 in FIGS. 1 and 3 is equal to 4*W'/L', and an overlapping area of the gate electrode 1312 of each transistor 130 relative to the active layer of the transistor is 4*W'*L'. For example, 4*W'/L' may be defined as a first predetermined value, and 4*W'*L' may be defined as a second predetermined value.

Based on the above research, the following schemes have been presented in the embodiments of the present disclosure through the improvement in the structure in FIG. 1.

Figure 6:
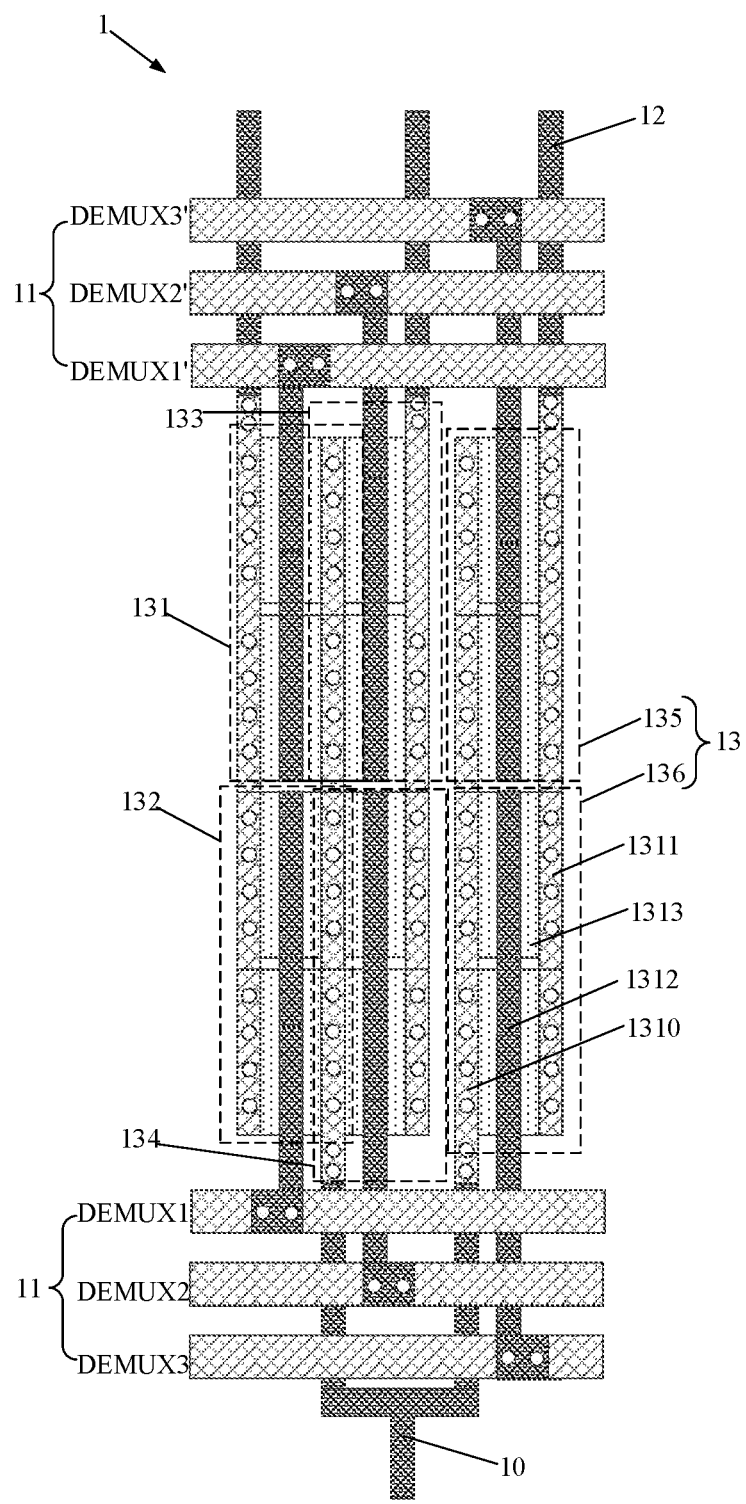
FIG. 6 is a schematic view showing a signal input circuitry according to one embodiment of the present disclosure.
Figure 7:
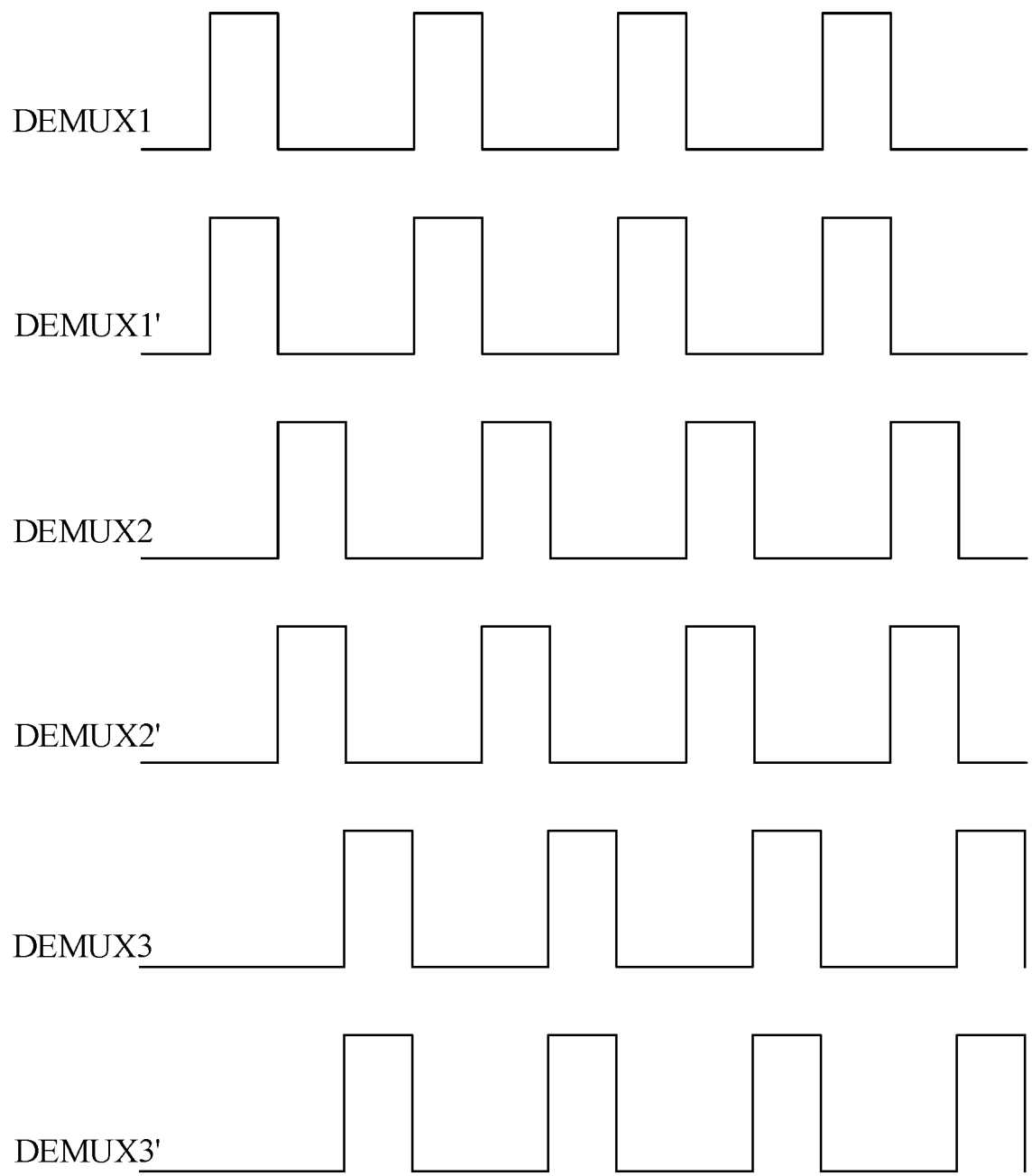
FIG. 7 is a timing sequence diagram of control signals for the signal input circuitry in FIG. 6.
Figure 8:
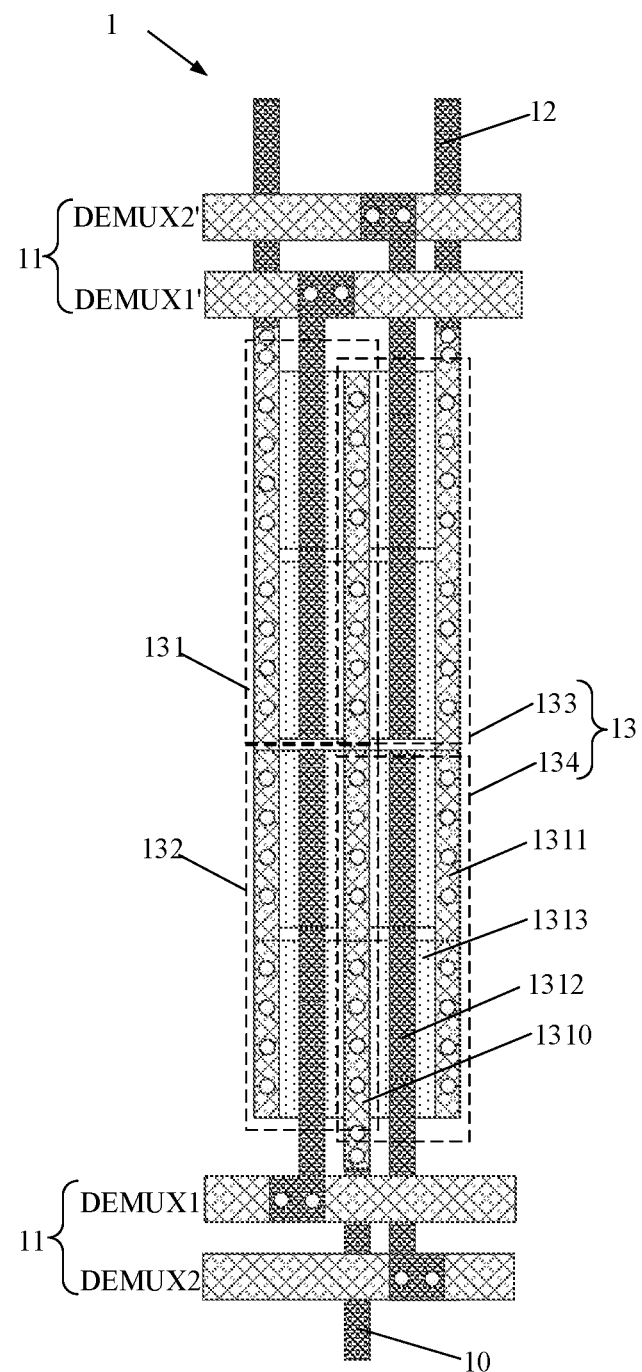
FIG. 8 is another schematic view showing the signal input circuitry according to one embodiment of the present disclosure.

Referring to FIGS. 6 to 8, the present disclosure provides in some embodiments a display panel which includes a plurality of signal input circuitries 1 (i.e., the above-mentioned DEMUX). At least one signal input circuitry 1 may include: a signal transmission line 10, a plurality of control signal lines 11, a plurality of data signal lines 12 and a plurality of signal input sub-circuitries 13 in one-to-one correspondence with the plurality of data signal lines 12 respectively.

Each signal input sub-circuitry 13 may include at least two transistors (e.g., a first transistor 131 and a second transistor 132), input transistors 1310 of which are coupled to the signal transmission line 10, output electrodes 1311 of which are coupled to a corresponding data signal line 12, and gate electrodes 1312 of which are coupled to the plurality of control signal lines 11 in one-to-one correspondence. A same control signal may be applied to the control signal lines 11 corresponding to a same signal input sub-circuitry 13, different control signals may be applied to the control signal lines 11 corresponding to different signal input sub-circuitries 13, and time periods within which the different control signals are at active levels may be staggered from each other, as shown in FIG. 7. A sum of width-to-length ratios of channels of the at least two transistors 131 may be equal to a first predetermined value, and an overlapping area of the gate electrode 1312 of each of the at least two transistors 131 relative to an active layer (including an active pattern 1313) of the transistor may be smaller than a second predetermined value in a direction perpendicular to a base substrate of the display panel.

In some embodiments, the first predetermined value may be a width-to-length ratio of a channel of one transistor when each signal input sub-circuitry includes the transistor in a one-to-one correspondence with the data signal line, and the second predetermined value may be an overlapping area of a gate electrode of one transistor relative to an active layer of the transistor when each signal input sub-circuitry includes the transistor in a one-to-one correspondence with the data signal line.

To be specific, the signal transmission line 10 may be coupled to a data signal output pin of a source driving IC in the display panel, and configured to receive a data signal from the pin. The plurality of control signal lines 11 may be arranged independent of each other. Alternatively, the control signal lines 11 corresponding to a same signal input sub-circuitry 13 may be coupled to each other, and the control signal lines 11 corresponding to different signal input sub-circuitries 13 may not be coupled to each other. Each data signal line 12 may be coupled to corresponding sub-pixel units in the display panel, and configured to transmit the received data signal to the corresponding subpixel units.

The signal input sub-circuitries 13 may be in one-to-one correspondence with the data signal lines 12, and each signal input sub-circuitry 13 may include at least two transistors. The input electrodes 1310 of the at least two transistors may be coupled to the signal transmission line 10. To be specific, the input electrodes 1310 of the at least two transistors may each be directly coupled to the signal transmission line 10, or the input electrodes 1310 of the at least two transistors may be coupled to each other, and the input electrode 1310 of the transistor closest to the signal transmission line 10 may be coupled to the signal transmission line 10, so that the input electrodes 1310 of the at least two transistors are coupled to the signal transmission line 10. Identically, the output electrodes 1311 of the at least two transistors may be coupled to the corresponding data signal line 12. To be specific, the output electrodes 1311 of the at least two transistors may each be directly coupled to the corresponding data signal line 12, or the output electrodes 1311 of the at least two transistors may be coupled to each other, and the output electrode 1311 of the transistor closest to the corresponding data signal line 12 may be coupled to the data signal line 12, so that the output electrodes 1311 of the at least two transistors are coupled to the corresponding data signal line 12.

The gate electrodes 1312 of the transistors in the plurality of signal input sub-circuitries 13 may be coupled to the plurality of control signal lines 11 in one-to-one correspondence. Each transistor is capable of being switched between an on state and an off state under the control of the control signal applied to the corresponding control signal line 11. More detailedly, a same control signal may be applied to the control signal lines 11 corresponding to the same signal input sub-circuitry 13, different control signals may be applied to the control signal lines 11 corresponding to different signal input sub-circuitries 13, and time periods within which the different control signals are at active levels may be staggered from each other. In this regard, when each signal input circuitry 1 is driven to operate, the signal input sub-circuitries 13 of the signal input circuitry 1 may be in an operating state sequentially, so as to transmit, in a time-division manner, the received data signal to the corresponding data signal lines 12.

It should be appreciated that, the display panel may include a display region and a peripheral region surrounding the display region. The signal transmission line 10, the control signal lines 11, the signal input sub-circuitries 13 and at least a part of each data signal line 12 may be arranged at the peripheral region. A remaining part of each data signal line 12 may extend to the display region and coupled to the corresponding subpixel units at the display region. In addition, the active level of the control signal may be a level capable of controlling the corresponding transistor to be in the on state.

In addition, the sum of the width-to-length ratios of the channels of the at least two transistors may be equal to the first predetermined value, and the overlapping area of the gate electrode 1312 of each of the at least two transistors relative to the active layer of the transistor may be smaller than the second predetermined value in the direction perpendicular to the base substrate of the display panel. More detailedly, as shown in FIGS. 6 and 7, each data signal line 12 may correspond to two transistors (e.g., the first transistor 131 and the second transistor 132), the width-to-length ratio of the channel of each transistor may be 2*W'/L', and a W/L value of the transistor corresponding to each data signal line 12 may be equal to 2*W'/L'+2*W'/L'=4*W'/L', i.e., the first predetermined value. The overlapping area of the gate electrode 1312 of each transistor relative to the active layer of the transistor may be 2*W'L', which is smaller than the second predetermined value.

Based on the above-mentioned structure of the display panel as well as a way for transmitting, in a time-division manner, the data signal to the data signal lines 12, the display panel in the embodiments of the present disclosure may include the plurality of signal input circuitries 1. Each signal input circuitry 1 may include the signal transmission line 10, the plurality of control signal lines 11, the plurality of data signal lines, and the plurality of signal input sub-circuitries in one-to-one correspondence with the plurality of data signal lines 12. Each signal input sub-circuitry 13 may include at least two transistors, the input electrodes 1310 of which are coupled to the signal transmission line 10 and the output electrodes 1311 of which are coupled to the corresponding data signal line 12. The gate electrodes 1312 of the transistors in the plurality of signal input sub-circuitries 13 may be coupled to the control signal lines 11 in one-to-one correspondence. In addition, the sum of the width-to-length ratios of the channels of the at least two transistors may be equal to the first predetermined value, and the overlapping area of the gate electrode 1312 of each of the at least two transistors relative to the active layer of the transistor may be smaller than the second predetermined value in the direction perpendicular to the base substrate of the display panel. The first predetermined value may be a width-to-length ratio of a channel of one transistor when each signal input sub-circuitry includes the transistor corresponding to the data signal line, i.e., 4*W'/L', and the second predetermined value may be an overlapping area of a gate electrode of one transistor relative to an active layer of the transistor when each signal input sub-circuitry includes the transistor corresponding to the data signal line, i.e., 4*W'*L', so as to reduce a channel capacitance of each transistor corresponding to the data signal line 12 without any change in the W/L of the transistor. When the data signal is transmitted by each signal input sub-circuitry 13 to the corresponding data signal line 12 (i.e., when the corresponding data signal line 12 is charged through the signal input sub-circuitry 13), it is able to effectively reduce the loss for the signal input sub-circuitry 13, improve the charging capability of the overall signal input circuitry 1, and achieve rapid response at lower power consumption. Hence, in the embodiments of the present disclosure, when the display panel includes the above-mentioned signal input circuitry 1, it is able to improve the image quality of the display panel. In addition, when the display panel is applied to a high-resolution display product, or a display product such as laptop computer, flat-panel computer or vehicle-mounted computer, it is able to reduce the power consumption of the display product.

Figure 10:
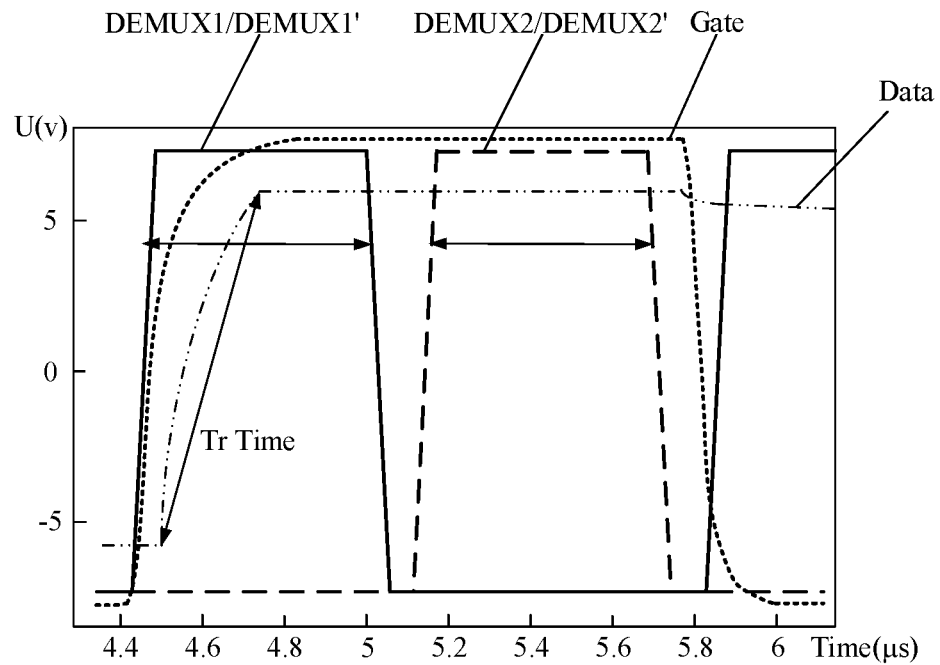
FIG. 10 is a simulation chart of the signal input circuitry in FIG. 8.

In addition, when the same control signal is applied to the control signal lines 11 corresponding to the same signal input sub-circuitry 13, different control signals are applied to the control signal lines 11 corresponding to different signal input sub-circuitries 13 and time periods within which the different control signals are at active levels are staggered from each other, it is able to transmit, in a time-division manner, the data signal to the corresponding data signal lines 12 through one signal input circuitry 1. In addition, as shown in FIG. 10, at least two transistors may be driven simultaneously to transmit the data signal to the corresponding data signal line 12, so it is able to significantly increase a rising time (Tr) and a falling time (Tf) of the data signal DATA transmitted on the data signal line 12, thereby to ensure a charging effect.

It should be appreciated that, the display panel in the embodiments of the present disclosure may be applied to, but not limited to, a thin film field-effect transistor liquid crystal display device manufactured using a Low Temperature Poly-silicon (LTPS) technique.

In some embodiments, a sum of the overlapping areas of the gate electrodes 1312 of the at least two transistors relative to the active layers of the at least two transistors may be equal to the second predetermined value in the direction perpendicular to the base substrate.

To be specific, the overlapping area of the gate electrode 1312 of each transistor relative to the active layer may be set according to the practical need, as long as it is smaller than the second predetermined value. For example, the sum of the overlapping areas of the gate electrodes 1312 of the at least two transistors relative to the active layers of the at least two transistors may be equal to the second predetermined value in the direction perpendicular to the base substrate, so as to improve the driving performance of the transistors in a better manner, thereby to improve the charging capability of the signal input circuitry 1.

The signal input sub-circuitries 13 may be arranged in various ways. In some embodiments, the plurality of signal input sub-circuitries 13 may be arranged sequentially in a direction perpendicular to an extension direction of the data signal line 12. Each signal input sub-circuitry 13 may include two transistors (e.g., the first transistor 131 and the second transistor 132) arranged sequentially in the extension direction of the data signal line 12, the input electrodes 1310 of the two transistors may be coupled to each other, the output electrodes 1311 of the two transistors may be coupled to each other, the input electrode 1310 of one of the two transistors may be coupled to the signal transmission line 10, and the output electrode 1311 of the other one of the two transistors may be coupled to the corresponding data signal line 12.

To be specific, a position of each signal input sub-circuitry 13 may be set according to the practical need. For example, the plurality of signal input sub-circuitries 13 may be arranged at the peripheral region of the display panel, and arranged sequentially in the direction perpendicular to the extension direction of the data signal line 12. In this regard, it is able to reduce an area of the peripheral region to the greatest extent, and provide the display panel with a narrow bezel.

Identically, a position of each transistor in each signal input sub-circuitry 13 may also be set according to the practical need. When each signal input sub-circuitry 13 includes two transistors, the two transistors may be arranged sequentially in the extension direction of the data signal line 12. In this arrangement mode, each signal input sub-circuitry 13 may have a relatively small width in the direction perpendicular to the extension direction of the data signal line 12, so it is able to provide more signal input sub-circuitries 13 at the peripheral region of the display panel, thereby to charge a large-scale, high-resolution display product in a better manner.

When the transistors in each signal input sub-circuitry 13 are arranged as mentioned hereinabove, the input electrodes 1310 of the two transistors (e.g., the first transistor 131 and the second transistor 132) may be coupled to each other, and the output electrodes 1311 of the two transistors may be coupled to each other. The input electrode 1310 of one of the two transistors (e.g., the second transistor 132) may be coupled to the signal transmission line 10, and the output electrode 1311 of the other one of the two transistors (e.g., the first transistor 131) may be coupled to the corresponding data signal line 12. More detailedly, when the two transistors are arranged as mentioned hereinabove, they may be arranged between the corresponding signal transmission line 10 and the corresponding data signal line 12 in such a manner that one transistor (e.g., the second transistor 132) is closer to the signal transmission line 10 and the other transistor (e.g., the first transistor 131) is closer to the data signal line 12, so as to enable the input electrode 1310 of the transistor closer to the signal transmission line 10 to be coupled to the signal transmission line 10 and enable the output electrode 1311 of the transistor closer to the data signal line 12 to be coupled to the corresponding data signal line 12. At this time, the input electrodes 1310 of the two transistors may be coupled to each other, the output electrodes 1311 of the two transmission may be coupled to each other. In this regard, it is able to reduce a length of a conductive connection line in the signal input sub-circuitry 13 while ensuring a normal charging function of the signal input sub-circuitry 13, thereby to effectively reduce an area of the signal input sub-circuitry 13 at the peripheral region.

Identically, two control signal lines 11 corresponding to the two transistors may be further arranged opposite to each other, and the two transistors may be arranged between the two control signal lines 11. In this regard, each of the two transistors may be arranged close to the corresponding control signal line 11, and when the gate electrode 1312 of each transistor is coupled to the corresponding control signal line 11, it is able to reduce the length of the conductive connection line, thereby to effectively reduce the area of the signal input sub-circuitry 13 at the peripheral region.

In some embodiments of the present disclosure, the active layer of each transistor may include at least two active patterns 1313 independent of each other, and an orthogonal projection of each active pattern 1313 onto the base substrate may partially overlap an orthogonal projection of the gate electrode 1312 of the transistor onto the base substrate, an orthogonal projection of the input electrode 1310 of the transistor onto the base substrate, and an orthogonal projection of the output electrode 1311 of the transistor onto the base substrate.

To be specific, when the active layer of each transistor includes the at least two active patterns 1313 independent of each other, and the orthogonal projection of each active pattern 1313 onto the base substrate partially overlaps the orthogonal projection of the gate electrode 1312 of the transistor onto the base substrate, the orthogonal projection of the input electrode 1310 of the transistor onto the base substrate and the orthogonal projection of the output electrode 1311 of the transistor onto the base substrate, it is able to form a corresponding channel through each active pattern 1313 and ensure a normal function of the resultant transistor. In addition, it is able to effectively reduce an overall area of the active layer, thereby to reduce the overlapping area of the active layer relative to the corresponding gate electrode 1312, reduce the channel capacitance of the transistor with the active layer, and improve the driving capability of the transistor.

It should be appreciated that, in the embodiments of the present disclosure, the quantity of signal input sub-circuitries 13 in each signal input circuitry 1 may be set according to the practical need, which will be described hereinafter in conjunction with two specific embodiments.

The display region of the display panel may include a plurality of subpixel units arranged in an array form, the plurality of subpixel units may include subpixel units in a first color, subpixel units in a second color and subpixel units in a third color, and the subpixel units in a same color maybe arranged in one column. In other words, the plurality of subpixel units may include the subpixel units in the first color arranged in columns, the subpixel units in the second color arranged in columns, and the subpixel units in the third color arranged in columns. The first color, the second color and the third color may be combined to achieve color display. For example, the first color may be red, the second color may be green, and the third color may be blue.

When each data signal line 12 corresponds to the subpixel units in one column, i.e., when the data signal is applied by each data signal line 12 to the subpixel units in one column, the signal input circuitry 1 may include at least two signal input sub-circuitries 13. For example, the signal input circuitry 1 may include three or two signal input sub-circuitries 13.

Each of the at least two signal input sub-circuitries is configured to transmit a color data signal from the signal transmission line 10 to a corresponding data signal line 12, and the data signal line 12 is configured to transmit the color data signal to the subpixel units of the display panel corresponding to the data signal line 12. Each signal input sub-circuitry is further configured to transmit color data signals for different colors to the corresponding subpixel units via the data signal line 12, and the subpixels in different colors corresponding to the at least two signal input sub-circuitries achieve color display.

To be specific, in some embodiments, each signal input circuitry may include a first signal input sub-circuitry, a second signal input sub-circuitry and a third signal input sub-circuitry. The first signal input sub-circuitry is configured to transmit a first color data signal from the signal transmission line 10 to a corresponding data signal line 12, and the data signal line 12 is configured to transmit the first color data signal to subpixel units of the display panel in a first color corresponding to the data signal line 12. The second signal input sub-circuitry is configured to transmit a second color data signal from the signal transmission line 10 to a corresponding data signal line 12, and the data signal line 12 is configured to transmit the second color data signal to subpixel units of the display panel in a second color corresponding to the data signal line 12. The third signal input sub-circuitry is configured to transmit a third color data signal from the signal transmission line 10 to a corresponding data signal line 12, and the data signal line 12 is configured to transmit the third color data signal to subpixel units of the display panel in a third color corresponding to the data signal line 12. Each of the first color, the second color and the third color may be one of red, green and blue respectively.

To be specific, as shown in FIG. 6, in some embodiments, each signal input circuitry 1 may include three signal input sub-circuitries 13 (i.e., a first signal input sub-circuitry, a second signal input sub-circuitry and a third signal input sub-circuitry). The first signal input sub-circuitry is configured to transmit a red data signal from the signal transmission line 10 to a corresponding data signal line 12, and the data signal line 12 is configured to transmit the red data signal to red subpixel units of the display panel corresponding to the data signal line 12. The second signal input sub-circuitry is configured to transmit a greed data signal from the signal transmission line 10 to a corresponding data signal line 12, and the data signal line 12 is configured to transmit the green data signal to green subpixel units of the display panel corresponding to the data signal line 12. The third signal input sub-circuitry is configured to transmit a blue data signal from the signal transmission line 10 to a corresponding data signal line 12, and the data signal line 12 is configured to transmit the blue data signal to blue subpixel units of the display panel corresponding to the data signal line 12.

When the signal input circuitry 1 includes three signal input sub-circuitries 13, the three signal input sub-circuitries 13 may be in one-to-one correspondence with the red subpixel units in one column, the green subpixel units in one column and the blue subpixel units in one column, so as to control a group of pixel units through one signal input circuitry 1. It should be appreciated that, each pixel unit may include one red subpixel unit, one green subpixel unit and one blue subpixel unit, and one group of pixel units may include the red subpixel units in one column, the green subpixel units in one column and the blue subpixel units in one column.

In some embodiments, as shown in FIG. 6, the first signal input sub-circuitry, the second signal input sub-circuitry and the third signal input sub-circuitry may be arranged sequentially in the direction perpendicular to the extension direction of the data signal line 12. The data signal line 12 may include a first data signal sub-line corresponding to the first signal input sub-circuitry, a second data signal sub-line corresponding to the second signal input sub-circuitry, and a third data signal sub-line corresponding to the third signal input sub-circuitry. The signal transmission line 10 may include a first signal transmission sub-line corresponding to the first signal input sub-circuitry, a second signal transmission sub-line corresponding to the second signal input sub-circuitry, and a third signal transmission sub-line corresponding to the third signal input sub-circuitry. The control signal line 11 may include a first control signal sub-line DEMUX1 and a second control signal sub-line DEMUX1' corresponding to the first signal input sub-circuitry, a third control signal sub-line DEMUX2 and a fourth control signal sub-line DEMUX2' corresponding to the second signal input sub-circuitry, and a fifth control signal sub-line DEMUX3 and a sixth control signal sub-line DEMUX3' corresponding to the third signal input sub-circuitry.

The first signal input sub-circuitry may include a first transistor 131 and a second transistor 132 arranged sequentially in the extension direction of the data signal line, input electrodes of the first transistor 131 and the second transistor 132 may be coupled to each other, and output electrodes of the first transistor 131 and the second transistor 132 may be coupled to each other. The input electrode of the first transistor 131 may be coupled to the first signal transmission sub-line, the output electrode of the second transistor 132 may be coupled to the first data signal sub-line, a gate electrode of the first transistor 131 may be coupled to the first control signal sub-line DEMUX1, and a gate electrode of the second transistor 132 may be coupled to the second control signal sub-line DEMUX1'.

The second signal input sub-circuitry may include a third transistor 133 and a fourth transistor 134 arranged sequentially in the extension direction of the data signal line, input electrodes of the third transistor 133 and the fourth transistor 134 may be coupled to each other, and output electrodes of the third transistor 133 and the fourth transistor 134 may be coupled to each other. The input electrode of the third transistor 133 may be coupled to the second signal transmission sub-line, the output electrode of the fourth transistor 134 may be coupled to the second data signal sub-line, a gate electrode of the third transistor 133 may be coupled to the third control signal sub-line DEMUX2, and a gate electrode of the fourth transistor 134 may be coupled to the fourth control signal sub-line DEMUX2'.

The third signal input sub-circuitry may include a fifth transistor 135 and a sixth transistor 136 arranged sequentially in the extension direction of the data signal line, input electrodes of the fifth transistor 135 and the sixth transistor 136 may be coupled to each other, and output electrodes of the fifth transistor 135 and the sixth transistor 136 may be coupled to each other. The input electrode of the fifth transistor 135 may be coupled to the third signal transmission sub-line, the output electrode of the sixth transistor 136 may be coupled to the third data signal sub-line, a gate electrode of the fifth transistor 135 may be coupled to the fifth control signal sub-line DEMUX3, and a gate electrode of the sixth transistor 136 may be coupled to the sixth control signal sub-line DEMUX3'.

The first control signal sub-line DEMUX1, the third control signal sub-line DEMUX2 and the fifth control signal sub-line DEMUX3 may be arranged at a first side of each of the first transistor 131, the second transistor 132, the third transistor 133, the fourth transistor 134, the fifth transistor 135 and the sixth transistor 136, and the second control signal sub-line DEMUX1', the fourth control signal sub-line DEMUX2' and the sixth control signal sub-line DEMUX3' may be arranged at a second side of each of the first transistor 131, the second transistor 132, the third transistor 133, the fourth transistor 134, the fifth transistor 135 and the sixth transistor 136 opposite to the first side.

As shown in FIG. 8, in some other embodiments, each signal input circuitry 1 may include two signal input sub-circuitries 13. A first signal input sub-circuitry of the two signal input sub-circuitries 13 is configured to transmit a first color data signal from the signal transmission line 10 to a corresponding data signal line 12, and the data signal line 12 is configured to transmit the first color data signal to subpixel units of the display panel in a first color corresponding to the data signal line 12. A second signal input sub-circuitry of the two signal input sub-circuitries 13 is configured to transmit a second color data signal from the signal transmission line 10 to a corresponding data signal line 12, and the data signal line 12 is configured to transmit the second color data signal to subpixel units of the display panel in a second color corresponding to the data signal line 12. The first color may include one of red, green and blue, and the second color may include another one of red, green and blue.

When the signal input circuitry 1 includes two signal input sub-circuitries 13, i.e., the first signal input sub-circuitry and the second signal input sub-circuitry, the first signal input sub-circuitry may be configured to transmit the first color data signal from the signal transmission line 10 to the corresponding subpixel units in the first color, and the second signal input sub-circuitry may be configured to transmit the second color data signal from the signal transmission line 10 to the corresponding subpixel units in the second color. In addition, the first color may include one of red, green and blue, and the second color may include another one of red, green and blue. In this regard, in all the signal input circuitries 1 of the display panel, the two signal input sub-circuitries 13 of each of a first part of signal input circuitries 1 may correspond to the red subpixel units and the green subpixel units respectively, the two signal input sub-circuitries 13 of each of a second part of signal input circuitries 1 may correspond to the red subpixel units and the blue subpixel units respectively, and the two signal input sub-circuitries 13 of each of a third part of signal input circuitries 1 may correspond to the green subpixel units and the blue subpixel units respectively, so it is able to charge all the subpixel units in the display panel.

In some embodiments, as shown in FIG. 8, the first signal input sub-circuitry and the second signal input sub-circuitry may be arranged sequentially in the direction perpendicular to the data signal line 12. The data signal line 12 may include a first data signal sub-line corresponding to the first signal input sub-circuitry and a second data signal sub-line corresponding to the second signal input sub-circuitry. The signal transmission line 10 may include a first signal transmission sub-line corresponding to the first signal input sub-circuitry and a second signal transmission sub-line corresponding to the second signal input sub-circuitry. The control signal line 11 may include a first control signal sub-line DEMUX1 and a second control signal sub-line DEMUX1' corresponding to the first signal input sub-circuitry, and a third control signal sub-line DEMUX2 and a fourth control signal sub-line DEMUX2' corresponding to the second signal input sub-circuitry.

The first signal input sub-circuitry may include a first transistor 131 and a second transistor 132 arranged sequentially in the extension direction of the data signal line 12, input electrodes of the first transistor 131 and the second transistor 132 may be coupled to each other, and output electrodes of the first transistor 131 and the second transistors 132 may be coupled to each other. The input electrode of the first transistor 131 may be coupled to the first signal transmission sub-line, the output electrode of the second transistor 132 may be coupled to the first data signal sub-line, a gate electrode of the first transistor 131 may be coupled to the first control signal sub-line DEMUX1, and a gate electrode of the second transistor 132 may be coupled to the second control signal sub-line DEMUX1'.

The second signal input sub-circuitry may include a third transistor 133 and a fourth transistor 134 arranged sequentially in the extension direction of the data signal line 12, input electrodes of the third transistor 133 and the fourth transistor 134 may be coupled to each other, and output electrodes of the third transistor 133 and the fourth transistors 134 may be coupled to each other. The input electrode of the third transistor 133 may be coupled to the second signal transmission sub-line, the output electrode of the fourth transistor 134 may be coupled to the second data signal sub-line, a gate electrode of the third transistor 133 may be coupled to the third control signal sub-line DEMUX2, and a gate electrode of the fourth transistor 134 may be coupled to the fourth control signal sub-line DEMUX2'.

The first control signal sub-line DEMUX1 and the third control signal sub-line DEMUX2 may be arranged at a first side of each of the first transistor 131, the second transistor 132, the third transistor 133 and the fourth transistor 134, and the second control signal sub-line DEMUX1' and the fourth control signal sub-line DEMUX2' may be arranged at a second side of each of the first transistor 131, the second transistor 132, the third transistor 133 and the fourth transistor 134 opposite to the first side.

Further, in two adjacent signal input sub-circuitries 13 of the signal input circuitry 1, the input electrode of the transistor of one signal input sub-circuitry 13 may be reused as the input electrode of the transistor of the other signal input sub-circuitry 13. For example, the input electrode of the transistor 131 may be reused as the input electrode of the transistor 133.

To be specific, as shown in FIG. 8, the input electrode of the transistor of one of the two adjacent signal input sub-circuitries 13 may be reused as the input electrode of the transistor of the other of the two adjacent signal input sub-circuitries 13, so as to not only ensure the normal operation performance of the two adjacent signal input sub-circuitries 13, but also effectively reduce an area of the signal input circuitry 1, thereby to meet the requirement on a narrow bezel of the display panel.

It should be appreciated that, a type of the transistor 131 may be selected according to the practical need. For example, the transistor 131 may be, but not limited to, an N-channel Metal Oxide Semiconductor (NMOS) thin film transistor or a P-channel Metal Oxide Semiconductor (PMOS) thin film transistor.

Figure 9:
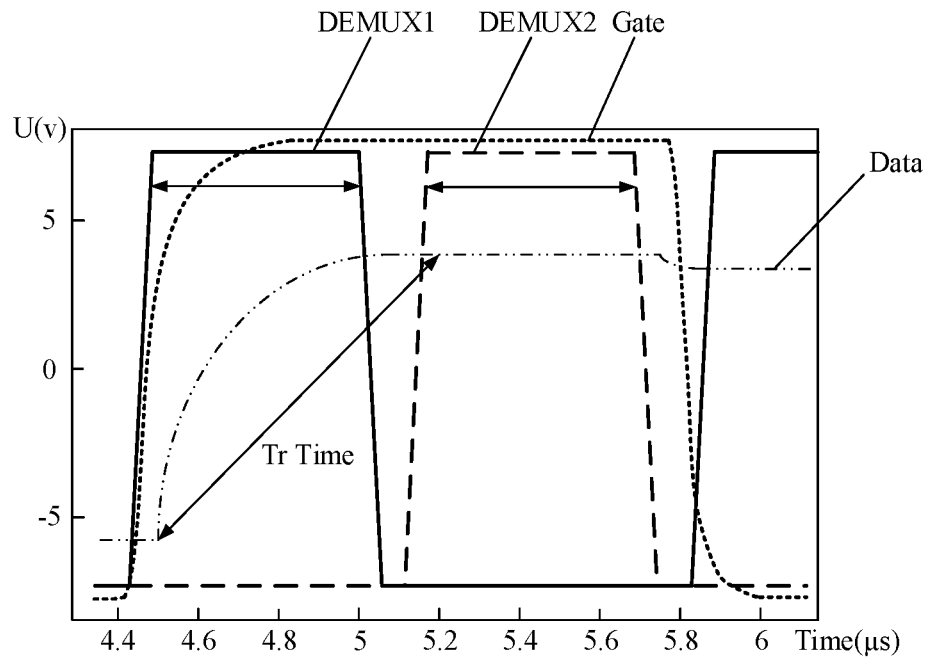
FIG. 9 is a simulation chart of the signal input circuitry in FIG. 3.

Taking the signal input circuitry 1 including two signal input sub-circuitries 13 as an example, when the signal input circuitries 1 in FIGS. 3 and 8 are applied to a display product having a resolution of 1800*1800, a charging process is simulated, and FIGS. 9 and 10 show simulation results.

As shown in FIGS. 3 and 9, when the DEMUX1 is at an active level, the data signal Data is always in a rising state, and a maximum voltage value of the data signal is smaller than a target value, i.e., 5V. When the DEMUX2 is at an active level, the data signal Data is in a stable state, but the maximum voltage value of the data signal Data is still smaller than the target value, i.e., 5V. Hence, there is such a problem that the input signal circuitry in FIG. 3 is charged insufficiently. In this case, when the display panel is a liquid crystal display panel and an image is displayed, the voltage value of the data signal received by most of the subpixel units in the liquid crystal display panel is far less than a desired liquid crystal deflection voltage, so the light transmittance may be relatively low and the image quality may be adversely affected.

However, for the signal input circuitry 1 adopted by the display panel in the embodiments, as shown in FIGS. 8 and 10, when the DEMUX1/DEMUX1' are at the active level, the data signal Data may rise rapidly and finally be in the stable state. A voltage value of the data signal Data in the stable state may be greater than the target value, i.e., 5V. When the DEMUX2/DEMUX2' are at the active level, the data signal Data may be still in the stable state, and the voltage value of the data signal Data may be still greater than the target value, i.e., 5V. Hence, there is no such a problem that the input signal circuitry in FIG. 8 is charged insufficiently. In this case, when the display panel is driven to display an image, it is able to refresh the images displayed on the display panel rapidly, thereby to rapidly turn on or turn off the high-resolution display panel.

It should be appreciated that, circles in FIGS. 1, 3, 4, 6 and 8 represent connection via-holes.

The present disclosure further provides in some embodiments a display device including the above-mentioned display panel.

Because the display panel includes the signal input circuitry 1, so it is able to provide excellent image quality and reduce the power consumption of the display panel. In addition, it is able for the display panel to significantly increase the rising time and the falling time of the data signal transmitted on the data signal line 12, thereby to ensure the charging effect of the display panel. Hence, when the display device includes the above-mentioned display panel, it is able to achieve all the above beneficial effects capable of being achieved by the display panel, which will not be particularly defined herein.

It should be appreciated that, the display device may be any product or member having a display function, e.g., a television, a display, a digital photo frame, a mobile phone or a flat-panel computer. In addition, the display device may further include a flexible circuit board, a printed circuit board and a back plate.

The present disclosure further provides in some embodiments a method of driving the above-mentioned display panel, which includes: within a charging time period, applying corresponding control signals to the plurality of control signal lines 11 in each signal input circuitry 1 of the display panel, a same control signal being applied to the control signal lines 11 corresponding to a same signal input sub-circuitry 13 of the signal input circuitry 1, different control signals being applied to the control signal lines 11 corresponding to different signal input sub-circuitries 13 of the signal input circuitry 1, and time periods within which the different control signals are at active levels being staggered from each other; and when the control signal is at an active level, enabling, by the signal input sub-circuitry 13, the corresponding signal transmission line 10 to be electrically connected to the corresponding data signal line 12.

To be specific, referring to FIGS. 6 and 7, each signal input circuitry 1 of the display panel may include three signal input sub-circuitries 13, and each signal input sub-circuitry 13 may include two transistors 131. A same first control signal may be applied to two first control signal lines (i.e., a first control signal sub-line DEMUX1 and a second control signal sub-line DEMUX1') corresponding to a first signal input sub-circuitry 13 of the three signal input sub-circuitries 13, a same second control signal may be applied to two second control signal lines (i.e., a third control signal sub-line DEMUX2 and a fourth control signal sub-line DEMUX2') corresponding to a second signal input sub-circuitry 13 of the three signal input sub-circuitries 13, and a same third control signal may be applied to two third control signal lines (i.e., a fifth control signal sub-line DEMUX3 and a sixth control signal sub-line DEMUX3') corresponding to a third signal input sub-circuitry 13 of the three signal input sub-circuitries 13. A time period within which the first control signal is at an active level, a time period within which the second control signal is at an active level and a time period within which the third control signal is at an active level may be staggered from each other, i.e., within a same time period, merely one control signal is at the active level. It should be appreciated that, in FIG. 7, the active level of each control signal may be a high level. Of course, the active level of each control signal may also be a low level.

Figure 2:
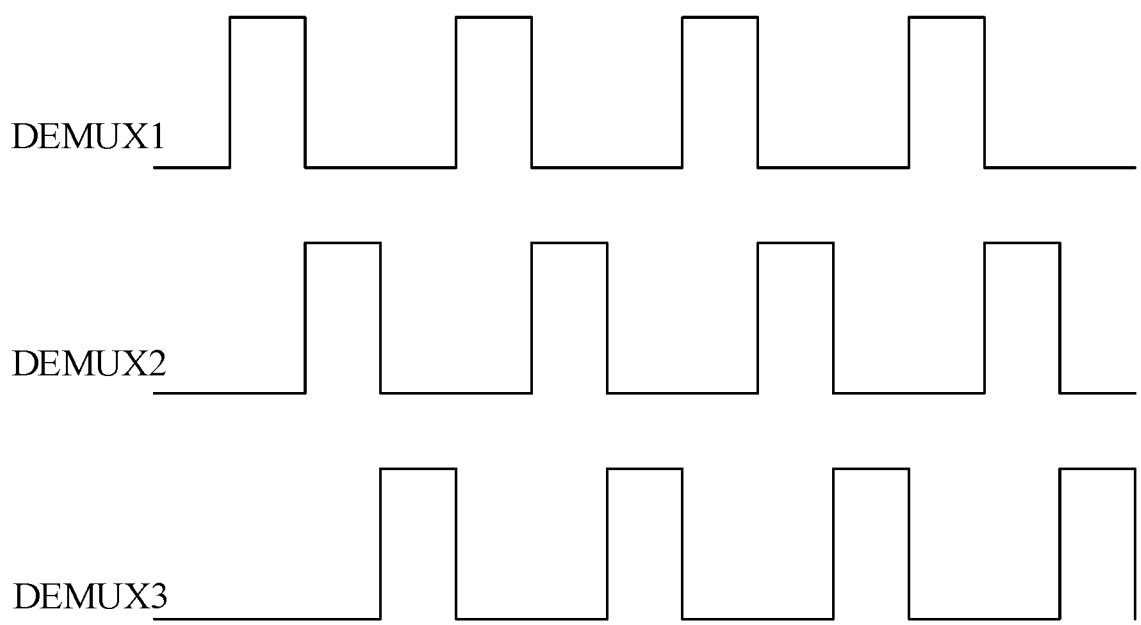
FIG. 2 is a timing sequence diagram of control signals for the signal input circuitry in FIG. 1.

As compared with a timing sequence diagram in FIG. 2, when the method in the embodiments of the present disclosure is used to drive the display panel, it is merely necessary to apply, through the source driving IC, the corresponding control signals to the additional DEMUX1', DEMUX2' and DEMUX3', so an implementation mode may be simple and convenient. As shown in FIG. 7, DEMUX1' and DEMUX1 may have a same timing sequence, DEMUX2' and DEMUX2 may have a same timing sequence, and DEMUX3' and DEMUX3 may have a same timing sequence.

More detailedly, when the display panel is driven to achieve a display function, within the charging time period, the subpixel units at the display region may be charged at first through the signal input circuitries 1 at the peripheral region of the display panel. A specific charging process will be described as follows. The subpixel units at the display region of the display panel may be scanned row by row (Gate in FIGS. 9 and 10 represents a scanning signal). When the pixel units in each row is scanned, the corresponding control signals may be applied to the plurality of control signal lines in each signal input circuitry 1 of the display panel. The same control signal may be applied to the control signal lines 11 corresponding to a same signal input sub-circuitry 13 of the signal input circuitry 1, so as to turn on all the transistors 131 of each signal input sub-circuitry 13 at the same time, thereby to transmit the received data signal to the corresponding data signal line 12. Meanwhile, different control signals may be applied to the control signal lines 11 corresponding to different signal input sub-circuitries 13 of the signal input circuitry 1, and the time periods within which the different control signals are at the active level may be staggered from each other, so as to drive the plurality of signal input sub-circuitries 13 in the same signal input circuitry 1 one by one, and transmit the data signals received from the signal transmission line 10 to the corresponding data signal line 12 one by one, thereby to perform a charging operation in a time-division manner.

It should be appreciated that, when the control signal is at an active level, the corresponding signal transmission line 10 may be electrically connected to the corresponding data signal line 12 through the signal input sub-circuitry 13.

When the display panel is driven using the method in the embodiments of the present disclosure, it is able to effectively reduce the loss for the signal input sub-circuitry 13 in the display panel, improve the charging capability of the overall signal input circuitry 1, improve the image quality of the display panel, and reduce the power consumption of the display product.

In addition, when the display panel is driven using the method in the embodiments of the present disclosure, the same control signal may be applied to the control signal lines 11 corresponding to the same signal input sub-circuitry 13, different control signals may be applied to the control signal lines 11 corresponding to different signal input sub-circuitries 13, and the time periods within which the different control signals are at the active level. In this regard, it is able to transmit, in a time-division manner, the data signal to the corresponding data signal line 12 through one signal input circuitry 1. In addition, at least two transistors may be driven at the same time to transmit the data signal to the corresponding data signal line 12, so it is able to significantly increase the rising time and the falling time of the data signal transmitted on the data signal line 12, thereby to ensure the charging effect.

In some embodiments of the present disclosure, when each signal input sub-circuitry 13 includes two transistors, the method may include, within the charging time period, when the control signal is at an active level, controlling, by the signal input sub-circuitry 13, the two transistors to be turned on, so as to enable the corresponding signal transmission line 10 to be electrically connected to the corresponding data signal line 12.

To be specific, within the charging time period, when the control signal is at an active level, a corresponding signal input sub-circuitry 13 of one signal input circuitry 1 may control the two transistors to be turned on, so as to enable the corresponding signal transmission line 10 to be electrically connected to the corresponding data signal line 12. In addition, at this time, the control signal for each of other signal input sub-circuitries 13 of the signal input circuitry 1 is not at an active level, so the transistors of other signal input sub-circuitries 13 may be in an off state, i.e., no data signal may be transmitted to the corresponding data signal line 12.

It should be further appreciated that, the above embodiments have been described in a progressive manner. For the description of same or similar parts between various embodiments, a cross-reference may be made to the embodiments. And each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a plurality of signal input circuitries, wherein at least one of the plurality of signal input circuitries comprises:
 a signal transmission line, a plurality of control signal lines, a plurality of data signal lines and a plurality of signal input sub-circuitries in one-to-one correspondence with the plurality of data signal lines,
 wherein: each signal input sub-circuitry comprises at least two transistors, input electrodes of which are coupled to the signal transmission line, output electrodes of which are coupled to a corresponding data signal line, and gate electrodes of which are coupled to the plurality of control signal lines in one-to-one correspondence;
 a same control signal is appliable to the control signal lines corresponding to a same signal input sub-circuitry, different control signals are appliable to the control signal lines corresponding to different signal input sub-circuitries, and time periods within which the different control signals are at active levels are staggered from each other; and
 a sum of width-to-length ratios of channels of the at least two transistors is equal to a first predetermined value, and an overlapping area of the gate electrode of each of the at least two transistors relative to an active layer of the transistor is smaller than a second predetermined value in a direction perpendicular to a base substrate of the display panel; and
 wherein the first predetermined value is a width-to-length ratio of a channel of one transistor when each signal input sub-circuitry comprises the transistor in a one-to-one correspondence with the data signal line, and the second predetermined value is an overlapping area of a gate electrode of one transistor relative to an active layer of the transistor when each signal input sub-circuitry comprises the transistor in a one-to-one correspondence with the data signal line.

2. The display panel according to claim 1, wherein a sum of the overlapping areas of the gate electrodes of the at least two transistors relative to the active layers of the at least two transistors is equal to the second predetermined value in the direction perpendicular to the base substrate.

3. The display panel according to claim 1, wherein the plurality of signal input sub-circuitries are arranged sequentially in a direction perpendicular to an extension direction of the data signal line, and wherein each signal input sub-circuitry comprises two transistors arranged sequentially in the extension direction of the data signal line, input electrodes of the two transistors are coupled to each other, output electrodes of the two transistors are coupled to each other, the input electrode of one of the two transistors is coupled to the signal transmission line, and the output electrode of the other one of the two transistors is coupled to the corresponding data signal line.

4. The display panel according to claim 3, wherein two control signal lines corresponding to the two transistors are arranged opposite to each other, and the two transistors are arranged between the two control signal lines.

5. The display panel according to claim 3, wherein the active layer of each transistor comprises at least two active patterns independent of each other, and an orthogonal projection of each active pattern onto the base substrate partially overlaps an orthogonal projection of the gate electrode of the transistor onto the base substrate, an orthogonal projection of the input electrode of the transistor onto the base substrate, and an orthogonal projection of the output electrode of the transistor onto the base substrate.

6. The display panel according to claim 3, wherein each signal input circuitry comprises at least two signal input sub-circuitries, each of the at least two signal input sub-circuitries is configured to transmit a color data signal from the signal transmission line to a corresponding data signal line, and the data signal line is configured to transmit the color data signal to subpixel units of the display panel corresponding to the data signal line, and wherein each signal input sub-circuitry is further configured to transmit color data signals for different colors to the corresponding subpixel units via the data signal lines, and the subpixels in different colors corresponding to the at least two signal input sub-circuitries achieve color display.

7. The display panel according to claim 6, wherein each signal input circuitry comprises a first signal input sub-circuitry, a second signal input sub-circuitry and a third signal input sub-circuitry; the first signal input sub-circuitry is configured to transmit a first color data signal from the signal transmission line to a corresponding data signal line, and the data signal line is configured to transmit the first color data signal to subpixel units of the display panel in a first color corresponding to the data signal line; the second signal input sub-circuitry is configured to transmit a second color data signal from the signal transmission line to a corresponding data signal line, and the data signal line is configured to transmit the second color data signal to subpixel units of the display panel in a second color corresponding to the data signal line; the third signal input sub-circuitry is configured to transmit a third color data signal from the signal transmission line to a corresponding data signal line, and the data signal line is configured to transmit the third color data signal to subpixel units of the display panel in a third color corresponding to the data signal line; and each of the first color, the second color and the third color is one of red, green and blue respectively.

8. The display panel according to claim 7, wherein the first signal input sub-circuitry, the second signal input sub-circuitry and the third signal input sub-circuitry are arranged sequentially in the direction perpendicular to the extension direction of the data signal line; the data signal line comprises a first data signal sub-line corresponding to the first signal input sub-circuitry, a second data signal sub-line corresponding to the second signal input sub-circuitry, and a third data signal sub-line corresponding to the third signal input sub-circuitry; the signal transmission line comprises a first signal transmission sub-line corresponding to the first signal input sub-circuitry, a second signal transmission sub-line corresponding to the second signal input sub-circuitry, and a third signal transmission sub-line corresponding to the third signal input sub-circuitry; the control signal line comprises a first control signal sub-line and a second control signal sub-line corresponding to the first signal input sub-circuitry, a third control signal sub-line and a fourth control signal sub-line corresponding to the second signal input sub-circuitry, and a fifth control signal sub-line and a sixth control signal sub-line corresponding to the third signal input sub-circuitry; the first signal input sub-circuitry comprises a first transistor and a second transistor arranged sequentially in the extension direction of the data signal line, input electrodes of the first transistor and the second transistor are coupled to each other, output electrodes of the first transistor and the second transistor are coupled to each other, the input electrode of the first transistor is coupled to the first signal transmission sub-line, the output electrode of the second transistor is coupled to the first data signal sub-line, a gate electrode of the first transistor is coupled to the first control signal sub-line, and a gate electrode of the second transistor is coupled to the second control signal sub-line; the second signal input sub-circuitry comprises a third transistor and a fourth transistor arranged sequentially in the extension direction of the data signal line, input electrodes of the third transistor and the fourth transistor are coupled to each other, output electrodes of the third transistor and the fourth transistor are coupled to each other, the input electrode of the third transistor is coupled to the second signal transmission sub-line, the output electrode of the fourth transistor is coupled to the second data signal sub-line, a gate electrode of the third transistor is coupled to the third control signal sub-line, and a gate electrode of the fourth transistor is coupled to the fourth control signal sub-line; the third signal input sub-circuitry comprises a fifth transistor and a sixth transistor arranged sequentially in the extension direction of the data signal line, input electrodes of the fifth transistor and the sixth transistor are coupled to each other, output electrodes of the fifth transistor and the sixth transistor are coupled to each other, the input electrode of the fifth transistor is coupled to the third signal transmission sub-line, the output electrode of the sixth transistor is coupled to the third data signal sub-line, a gate electrode of the fifth transistor is coupled to the fifth control signal sub-line, and a gate electrode of the sixth transistor is coupled to the sixth control signal sub-line; and the first control signal sub-line, the third control signal sub-line and the fifth control signal sub-line are arranged at a first side of each of the first transistor, the second transistor, the third transistor, the fourth transistor, the fifth transistor and the sixth transistor, and the second control signal sub-line, the fourth control signal sub-line and the sixth control signal sub-line are arranged at a second side of each of the first transistor, the second transistor, the third transistor, the fourth transistor, the fifth transistor and the sixth transistor opposite to the first side.

9. The display panel according to claim 6, wherein each signal input circuitry comprises a first signal input sub-circuitry and a second signal input sub-circuitry; the first signal input sub-circuitry is configured to transmit a first color data signal from the signal transmission line to a corresponding data signal line, and the data signal line is configured to transmit the first color data signal to subpixel units of the display panel in a first color corresponding to the data signal line; the second signal input sub-circuitry is configured to transmit a second color data signal from the signal transmission line to a corresponding data signal line, and the data signal line is configured to transmit the second color data signal to subpixel units of the display panel in a second color corresponding to the data signal line; and the first color comprises one of red, green and blue, and the second color comprises another one of red, green and blue.

10. The display panel according to claim 9, wherein the first signal input sub-circuitry and the second signal input sub-circuitry are arranged sequentially in the direction perpendicular to the data signal line; the data signal line comprises a first data signal sub-line corresponding to the first signal input sub-circuitry and a second data signal sub-line corresponding to the second signal input sub-circuitry; the signal transmission line comprises a first signal transmission sub-line corresponding to the first signal input sub-circuitry and a second signal transmission sub-line corresponding to the second signal input sub-circuitry; the control signal line comprises a first control signal sub-line and a second control signal sub-line corresponding to the first signal input sub-circuitry, and a third control signal sub-line and a fourth control signal sub-line corresponding to the second signal input sub-circuitry; the first signal input sub-circuitry comprises a first transistor and a second transistor arranged sequentially in the extension direction of the data signal line, input electrodes of the first transistor and the second transistor are coupled to each other, output electrodes of the first transistor and the second transistor are coupled to each other, the input electrode of the first transistor is coupled to the first signal transmission sub-line, the output electrode of the second transistor is coupled to the first data signal sub-line, a gate electrode of the first transistor is coupled to the first control signal sub-line, and a gate electrode of the second transistor is coupled to the second control signal sub-line; the second signal input sub-circuitry comprises a third transistor and a fourth transistor arranged sequentially in the extension direction of the data signal line, input electrodes of the third transistor and the fourth transistor are coupled to each other, output electrodes of the third transistor and the fourth transistor are coupled to each other, the input electrode of the third transistor is coupled to the second signal transmission sub-line, the output electrode of the fourth transistor is coupled to the second data signal sub-line, a gate electrode of the third transistor is coupled to the third control signal sub-line, and a gate electrode of the fourth transistor is coupled to the fourth control signal sub-line; and the first control signal sub-line and the third control signal sub-line are arranged at a first side of each of the first transistor, the second transistor, the third transistor and the fourth transistor, and the second control signal sub-line and the fourth control signal sub-line are arranged at a second side of each of the first transistor, the second transistor, the third transistor and the fourth transistor opposite to the first side.

11. The display panel according to claim 6, wherein in two adjacent signal input sub-circuitries of the signal input circuitry, the input electrode of the transistor of one signal input sub-circuitry is reused as the input electrode of the transistor of the other signal input sub-circuitry.

12. A display device, comprising the display panel according to claim 1.

13. A method of driving the display panel according to claim 1, comprising: within a charging time period, applying corresponding control signals to the plurality of control signal lines in each signal input circuitry of the display panel, a same control signal being applied to the control signal lines corresponding to a same signal input sub-circuitry of the signal input circuitry, different control signals being applied to the control signal lines corresponding to different signal input sub-circuitries of the signal input circuitry, and time periods within which the different control signals are at active levels being staggered from each other; and when the control signal is at an active level, enabling, by the signal input sub-circuitry, the corresponding signal transmission line to be electrically connected to the corresponding data signal line.

14. The method according to claim 13, wherein when each signal input sub-circuitry comprises two transistors, the method comprises, within the charging time period, when the control signal is at an active level, controlling, by the signal input sub-circuitry, the two transistors to be turned on, so as to enable the corresponding signal transmission line to be electrically connected to the corresponding data signal line.

* * * * *